United States Patent [19]
Joo et al.

[11] Patent Number: 5,874,379
[45] Date of Patent: Feb. 23, 1999

[54] DIELECTRIC THIN FILM AND FABRICATION METHOD THEREOF

[75] Inventors: Seung-Ki Joo, Seoul; Jae-Hyun Joo, Kyungki-Do, both of Rep. of Korea

[73] Assignee: LG Semicon Co., Ltd., Choongcheongbuk-Do, Rep. of Korea

[21] Appl. No.: 610,282

[22] Filed: Mar. 4, 1996

[30] Foreign Application Priority Data

Mar. 4, 1995 [KR] Rep. of Korea .................... 1995 4435

[51] Int. Cl.$^6$ .......................... C04B 35/468; C04B 35/47
[52] U.S. Cl. ........................................... 501/138; 501/139
[58] Field of Search ................................. 501/134, 137, 501/138, 139

[56] References Cited

U.S. PATENT DOCUMENTS

| | | | |
|---|---|---|---|
| 3,033,907 | 5/1962 | Rue ......................................... | 501/134 |
| 3,819,990 | 6/1974 | Hayashi et al. .......................... | 501/138 |
| 4,642,732 | 2/1987 | Ikeda et al. .............................. | 501/138 |
| 4,957,888 | 9/1990 | Brand et al. ............................. | 501/134 |
| 4,987,107 | 1/1991 | Narumi et al. .......................... | 501/139 |
| 5,051,864 | 9/1991 | Chazono et al. ........................ | 501/134 |
| 5,086,021 | 2/1992 | Sasaki et al. ........................... | 501/138 |
| 5,314,651 | 5/1994 | Kulwicki ................................. | 501/139 |
| 5,441,670 | 8/1995 | Shimamune et al. ................... | 501/134 |

*Primary Examiner*—Deborah Jones

[57] ABSTRACT

An improved dielectric thin film and a capacitor with the same for a semiconductor and a fabrication method thereof capable of preventing leakage current in operation, which dielectric thin film includes (Ba, Sr)TiO$_3$ containing Ta, and which the capacitor includes a substrate; an interlayer insulation layer formed on a substrate, thereby exposing a predetermined portion of the substrate to the outside; a lower electrode formed on a predetermined portion of the interlayer insulation layer including the exposed portion of the substrate; a dielectric thin film consisting of (Ba, Sr)TiO$_3$ containing Ta and formed on the interlayer insulation film including the lower electrode; and an upper electrode formed on the dielectric thin film.

44 Claims, 5 Drawing Sheets

DIELECTRIC THIN FILM AND FABRICATION METHOD THEREOF

BACKGROUND OF THE INVENTION

1. Field of the Invention

The present invention relates to a dielectric thin film (e.g., for a capacitor in a semiconductor apparatus) and a fabrication method thereof, and in particular to an improved dielectric thin film and a fabrication method thereof capable of preventing leakage current in operation by providing a dielectric thin film.

2. Description of the Conventional Art

As well known to those skilled in the art, a unit device of a Dynamic Random Access Memory (DRAM) consists of one transistor and one information storing capacitor. The storing capacity of the information storing capacitor has a storing capacity of at least 30 fF/cell so as to prevent a soft error operation which is caused by α-particle.

The more the integration level of the DRAM apparatus is increased, the more the problem for increasing storing capacity in a limited cell space occurs. In order to overcome the problem, the following methods are introduced in the industry based on an expression of (1).

$$C = \in_o \in_r A/d \tag{1}$$

where C denotes a storing capacity of a battery, $\in_o$ denotes a dielectric constant in vacuum, $\in_r$ denotes a dielectric constant of a dielectric thin film, A denotes a surface of a battery, and d denotes a thickness of a dielectric thin film.

The first method is to make the thickness of a dielectric thin film thinner, the second method is to increase the effective surface of a capacitor, and the third method is to use a certain material having a greater dielectric constant.

Among theses methods, the first method has a disadvantage in that it is difficult to adapt to a large scale memory device since the reliability of the thin film is decreased due to the Fowler-Nordheim current in case that the thickness of a dielectric layer is below 100 Å.

The second method has disadvantages in that manufacturing process has complexity, and manufacturing cost is increased. That is, although various kinds of capacitor cells, having a three dimensional construction, such as a stack type, a trench type, a fin type, and a cylindrical type are used in 4 MB DRAM and 16 MB DRAM, the above-mentioned capacitor cells can not be effectively used in 64 MB and 256 MB DRAMs.

In addition, the trench type capacitor has a disadvantage in that a leakage current between trenches occurs due to a scaling down operation, and since the cell of the stack type, the fin type, and the cylindrical type have many curved portions and step coverage on the surfaces thereof in order to obtain more storing capacity, it is difficult to perform a photolithography process in the follow-up process, and mechanical strength of the thin film and the cylindrical capacitor is very weak.

The third method is directed to using a high dielectric constant material such as $Y_2O_3$, $Ta_2O_5$, $TiO_2$, etc, and recently, a ferroelectric material such as a PZT($PbZr_xTi_{1-x}O_3$) or a BST($Ba_xSr_{1-x}TiO_3$) are used. Generally, the ferroelectric material has a self-polarizing characteristic and a dielectric constant from a few hundreds to 1,000. Using this ferroelectric material, it is possible to fabricate a desired thin film having an equivalent oxide thickness of below 10 Å even forming a ferroelectric film having a thickness of a few hundreds.

In particular, the BST among the ferroelectric materials is proper as a high dielectric constant material for a DRAM capacitor since it has a high dielectric constant even in a high frequency as compared to a PZT, and fatigue and aging phenomenon are removed since it is converted to a paraelectric material in accordance with a ratio of Ba/Sr.

Conventionally, a sputtering method, a metal-organic chemical vapor deposition method (MOCVD), a spin coating method, or an aerosol method is used for integrating a high dielectric constant material in a semiconductor apparatus. Sputtering generally involves four steps: ions are generated and directed at a target; the ions sputter target atoms; the ejected (sputtered) atoms are transported to the substrate; and the sputtered atoms condense and form a thin film.

However, the problems occurring while fabricating a BST thin film for use of the DRAM capacitor is that a dielectric constant is decreased since the thickness of a dielectric thin film becomes thin and a more leakage current occurs at a real operation voltage level. In this case, it is possible to prevent the decrease of the dielectric constant through a fabrication process, however, since the phenomenon that the leakage current is decreased and the breakage magnetic field is reduced are the inherent problems of the material, it is the most important problems in really using the BST thin film in the industry.

Therefore, when fabricating the capacitor of the semiconductor apparatus using the BST thin film, the reliability of the semiconductor apparatus is decreased due to a characteristic deterioration of the capacitor.

To improve the above-mentioned problems, a method for improving a dielectric characteristic of the BST thin film which is so bulky and used in a separate device of a ceramic capacitor is disclosed in the industry, which is characterized to add other materials to the BST thin film.

For example, the U.S. Pat. No. 4,058,404 discloses a method for increasing the dielectric constant and for preventing a dielectric variation in accordance with applied voltage. The above method is characterized to insulating using $SrTiO_3$ of about 18–70%, $BaTiO_3$ of about 4–7%, $Bi_2O_3$ of 2.5–17.5%, and either NiO, $Al_2O_3$, or $Cu_2O$.

In addition, the U.S. Pat. No. 4,888,246 discloses another method for improving the reliability of the high dielectric constant material and for increasing breakage electric field of a dielectric thin film having a Nitrogen-contained BST by adding Nitrogen into a sputtering gas when depositing a thin film in a sputtering method and the Perovskite structure of $AMO_3$.

SUMMARY OF THE INVENTION

Accordingly, it is an object of the present invention to provide a dielectric thin film (e.g., for a capacitor in a semiconductor apparatus) and a fabrication method thereof, which overcomes the problems encountered in a conventional capacitor for a semiconductor and a fabrication method thereof.

It is another object of the present invention to provide an improved dielectric thin film and a fabrication method thereof capable of decreasing leakage current at a real operation temperature when fabricating a dielectric thin film and improving a frequency characteristic of a dielectric thin film by changing an inherent physical characteristic of the dielectric thin film material.

It is another object of the present invention to provide a capacitor and a fabrication thereof for a semiconductor apparatus which adapts a dielectric thin film having a characteristic of decreasing a leakage current.

To achieve the above objects, in accordance with an aspect of the present invention, there is provided a dielectric thin film, which includes (Ba, Sr)$TiO_3$ and Ta.

To achieve the above objects, in accordance with another aspect of the present invention, there is provided a dielectric thin film fabrication method, which is directed to forming a dielectric thin film including (Ba, Sr)$TiO_3$ and Ta therein on a lower layer which is heated to a predetermined temperature by concurrently sputtering at least more than one target mainly composed of Ba, Sr, Ti, and Ta and a sputtering gas.

To achieve the above objects, in accordance with another aspect of the present invention, there is provided a dielectric thin film fabrication method, which is directed to forming a dielectric thin film including (Ba, Sr)$TiO_3$ and Ta therein on a substrate in a chemical vapor deposition method with respect to a reactive source gas of a metal-organic compound or a metal halogen compound each containing Ba, Sr, Ti, and Ta, which is introduced into a reaction container having a lower layer, which is heated to a predetermined temperature.

To achieve the above objects, in accordance with another aspect of the present invention, there is provided a capacitor for a semiconductor apparatus, which includes a substrate; an interlayer insulation layer formed on a substrate, thereby exposing a predetermined portion of the substrate to the outside; a lower electrode formed on a predetermined portion of the interlayer insulation layer including the exposed portion of the substrate; a dielectric thin film including (Ba, Sr)$TiO_3$ and Ta and formed on the interlayer insulation film including the lower electrode; and an upper electrode formed on the dielectric thin film.

To achieve the above objects, there is provided a dielectric thin film fabrication method for a semiconductor apparatus, which includes the steps of a first step which forms an interlayer insulation film on a substrate, thus exposing a predetermined portion of the substrate; a second step which forms a lower electrode on a predetermined portion of the interlayer insulation film including the exposed portion of the substrate; a third step which forms a dielectric thin film including (Ba, Sr)$TiO_3$ and Ta on the interlayer insulation film containing a lower electrode; and a fourth step which forms an upper electrode on the dielectric thin film.

DETAILED DESCRIPTION OF THE INVENTION

Referring to FIGS. 1 through 4A through 4I, the BST (Ba, Sr)$TiO_3$ thin film fabrication method of a preferred embodiment according to the present invention is similar to the conventional BST thin film fabrication method except for a method for changing the inherent physical characteristic of the thin film so as to fabricate a desired dielectric thin film.

That is, the method is directed to fabricating a BST thin film into which Ta is added at a lower layer by providing $BaTiO_3$, $SrTiO_3$ and Ta or $Ta_2O_5$ to a 3-gun magnetron co-sputter, applying direct or alternating current thereto individually, and sputtering gas of 3–10 mTorr of argon, oxygen or argon and oxygen. Here, the lower layer means a substrate/electrode stack layer in which the electrode layer is formed on the substrate.

Here, the temperature of the substrate is in a range of 400°–700° C. (preferably about 550° C.) so as to improve a physical characteristic and a crystalline property of a dielectric thin film to be formed.

Ta contained in the BST thin film can be added by 10 atom-percent based on the total weight of the BST thin film. Here, the total deposition thickness of the dielectric thin film is within a range of 200–2000 Å. A range of 400–1000 Å is optimum.

The ratio of oxygen out of sputtering gas used in the above process is 10–90 volume-percent. In this embodiment, the ratio of oxygen is 45–55 volume-percent.

When fabricating a dielectric thin film, since the substrate is exposed in an oxidizing environment of the corresponding process, the lower electrode layer formed on the substrate is oxidized. The lower electrode layer is formed with a material having a base component of Pt, Ir, Ru, $IrO_2$, $RuO_2$, etc, which has a good anti-oxidizing property or forms a conductive layer if oxidized.

In this case, the ratio of Ba/Sr and the amount of Ta can be individually controlled by controlling voltage level applied to each sputter gun.

Meanwhile, the dielectric thin film can be fabricated using a metal target containing Ba, Sr, Ti, and Ta or a (perferably) conductive oxide target for an easier fabrication according to the present invention.

In this case, single component targets such as (Ba, Sr)$TiO_3$ and Ta or a (Ba, Sr)$TiO_3$ and $Ta_2O_5$ which is used to obtain a certain ratio of components.

Here, in case of the metal target or the conductive oxide target, direct current voltage is used, and gas containing a base component of oxygen or oxygen and argon as a sputtering gas is used. In case of using an oxide target without conductive property, alternating current is used, and gas containing a base component of oxygen, argon or oxygen and argon is used as a sputtering gas.

Here, two targets can be used for changing the composition of a thin film when sputtering in this embodiment of the present invention.

Alternatively, a dielectric thin film can be formed using a plurality of concurrently sputtered targets corresponding individually to Ba, Sr, Ti, and Ta.

The above-mentioned two targets can take the form of a metal target or an oxide target each having a base component of Ba, Sr, and Ti or a target of Ta or $Ta_2O_5$, or a target having a base component of Sr, Ti, and Ta and a target having Ba, Ti, and Ta. In addition, it is possible to combine a target having a base component of $BaTiO_3$ and a target having a base component of $SrTiO_3$ containing Ta, and to combine a target having a base component of (Ba, Sr)$Tio_3$ and a target having a base component of Ta or $Ta_2O_5$.

In addition, there is another method for forming the dielectric film of the invention, namely; performing a chemical vapor deposition so as to effectively use complex curved surface, narrow aperture, or vertical surface of electrodes.

When performing a chemical vapor deposition, a metal-organic compound or a metal halogen compound are mainly used as a reaction source. As reaction sources used for fabricating a BST thin film containing Ta, metal-organic compounds such as $Ba(thd)_2$, $Sr(thd)_2$, $Ba(dpm)_2$, $Sr(dpm)_2$, $Ti(i-OPr)_4$, $Ti(i-OPr)_2$, $(thd)_2$, $Ti(t-OBu)_4$, $Ti(dpm)_4$, $Ti(OC_2H_5)_4$, $Ta(OC_2H_5)_5$, etc, and metal halogen materials such as $TiCl_4$, $TaCl_5$, etc, can be used. Here, in the above-mentioned explanations, the expressions in the brackets denote ligand names, where thd is an abbreviation of $C_{11}H_{19}O_2$, dpm is an abbreviation of $C_{22}H_{19}O_2$, i-OPr is an abbreviation of $OCH(CH_3)_2$ and t-OBu is an abbreviation of $C_4H_9O$.

The most general reaction source method is to control the compositions of the thin film to be deposited by individually controlling the amount of four reaction gases each containing one element among Ba, Sr, Ti, and Ta.

In this case, a method of forming a BST thin film containing Ta using a metal-organic compound reaction source can obtain a better characteristic of a dieletric thin film compared to a method of forming a BST thin film containing Ta using a metal halogen reaction source.

However, in order to have a predetermined value of a composition ratio of a dielectric thin film to be formed, it is possible to form a dielectric thin film using a reaction gas containing two kinds of components such as Ba and Sr, Ba and Ti, Sr and Ti, etc, and it is also possible to form a dielectric thin film by combining a plurality of reaction sources at a predetermined ratio.

The method of forming a dielectric thin film on a substrate on which a lower layer (electrode layer) is formed using the above-mentioned reaction gas will now be explained.

That is, a reactive source gas containing Ba, Sr, Ti and Ta is introduced into a reaction container provided with a lower layer which is heated to a predetermined temperature, for example, at 550°–650° C., and the reactive source gas is decomposed therein in cooperation with the heated substrate, and the gas which is not deposited on the substrate is discharged to the outside of the reaction container using a pump, so that a BST thin film containing Ta is formed. Here, the lower layer is referred to as a substrate/electrode-laminated configuration.

When heating the substrate to a temperature to 550°–650° C., the reactive source gas decomposes at 100°–200° C. of the substrate. However, in fact, it is necessary to maintain the temperature of the substrate of about 400°–700° C. so as to achieve a desired deposition, and it is necessary to heat the substrate to a temperature over 550° C. so as to achieve a desired dielectric thin film.

In addition, the reactive source gas can be decomposed by a predetermined energy generated from plasma, infrared ray, electron ray, ion ray, X-ray, etc, as well as the heat generated from the substrate. Therefore, the purpose of the chemical vapor deposition method of the present invention can be achieved by the above-mentioned methods. In this case, it is necessary to heat the substrate to the temperature of 100°–200° C.

The characteristic of the BST thin film containing Ta fabricated in the above-mentioned methods (the sputtering method or the chemical vapor deposition method) will now be explained.

Figure 1:
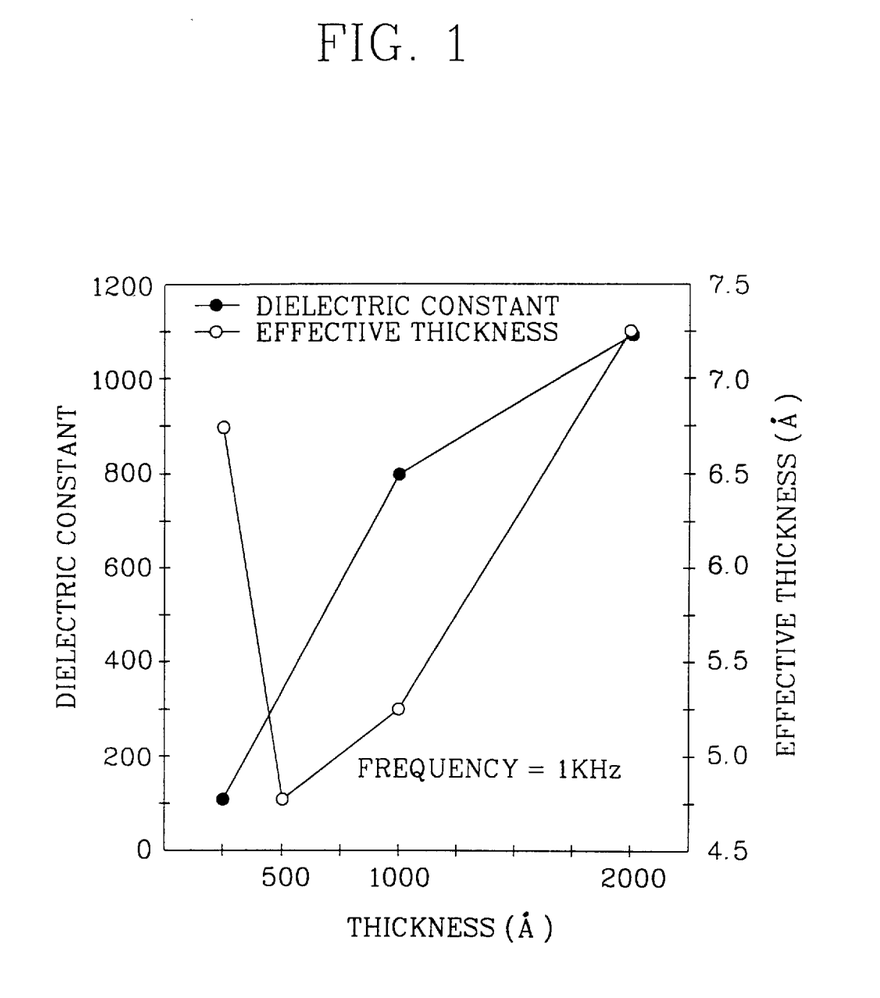
FIG. 1 is a graph of a dielectric constant and an effective thickness variation in accordance with a thickness variation of a BST thin film into which Ta is not added according to the present invention.

To begin with, FIG. 1 shows a relationship between the dielectric constant and effective thickness varying in accordance with the thickness variation of the BST thin film which does not contain Ta.

Here, the effective thickness means a characteristic of the dielectric thin film with respect to a silicon oxide, and it can be expressed as follows.

$$\text{Teff} = (\epsilon_{SiO2}/\epsilon_{BST}) * T_{BST} \quad (2)$$

where Teff denotes the effective thickness, $\epsilon_{SiO2}$ denotes a dielectric constant of the silicon oxide, $\epsilon_{BST}$ denotes the dielectric constant of the thin film, and $T_{BST}$ denotes the thickness of the BST thin film.

Here, when the effective thickness of the dielectric thin film is 500 Å, the effective thickness is minimum.

Figure 2:
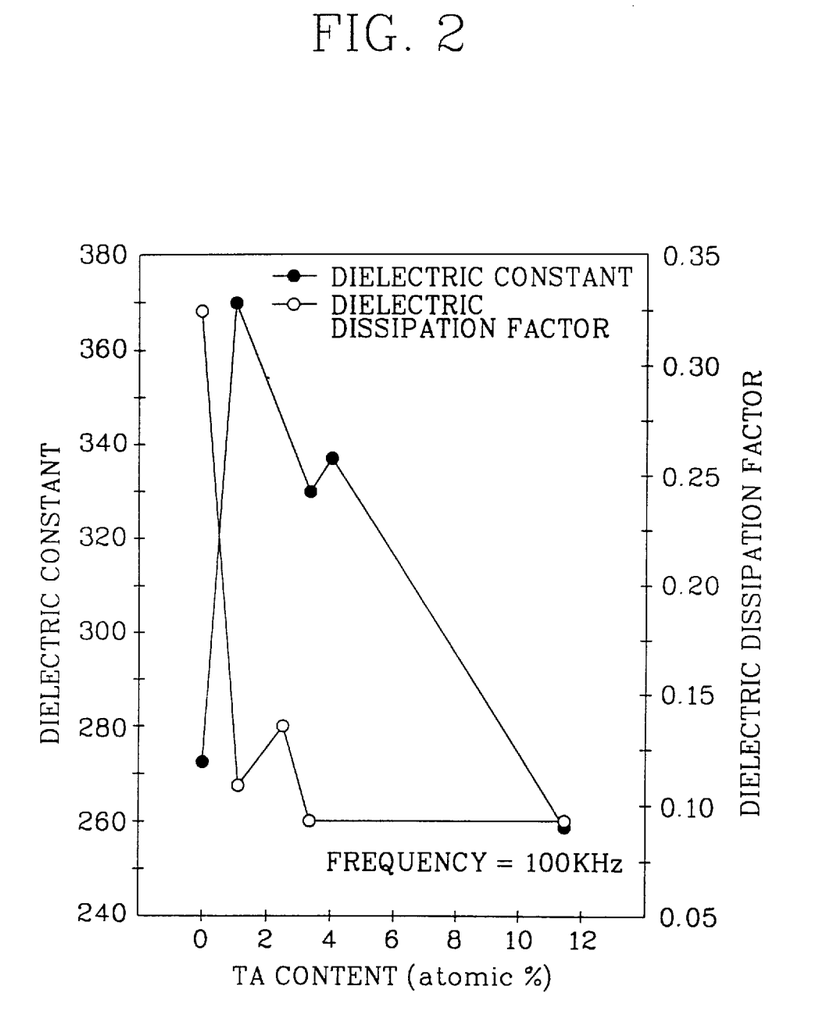
FIG. 2 is a graph of a dielectric constant and a dielectric dissipation factor of a BST thin film in accordance with the amount of Ta added into the BST thin film according to the present invention.

FIG. 2 shows a relationship between the dielectric constant and a dielectric dissipation factor (tan δ) in accordance with an addition of Ta into the BST thin film having a minimum effective thickness of 500 Å.

As seen therefrom, when adding Ta into the BST thin film, the dielectric constant is increased until the amount of Ta is 2%, at which the dielectric constant is maximum, and then it is decreased. In addition, the dielectric dissipation factor is sharply decreased until the amount of Ta is 2%.

Figure 3:
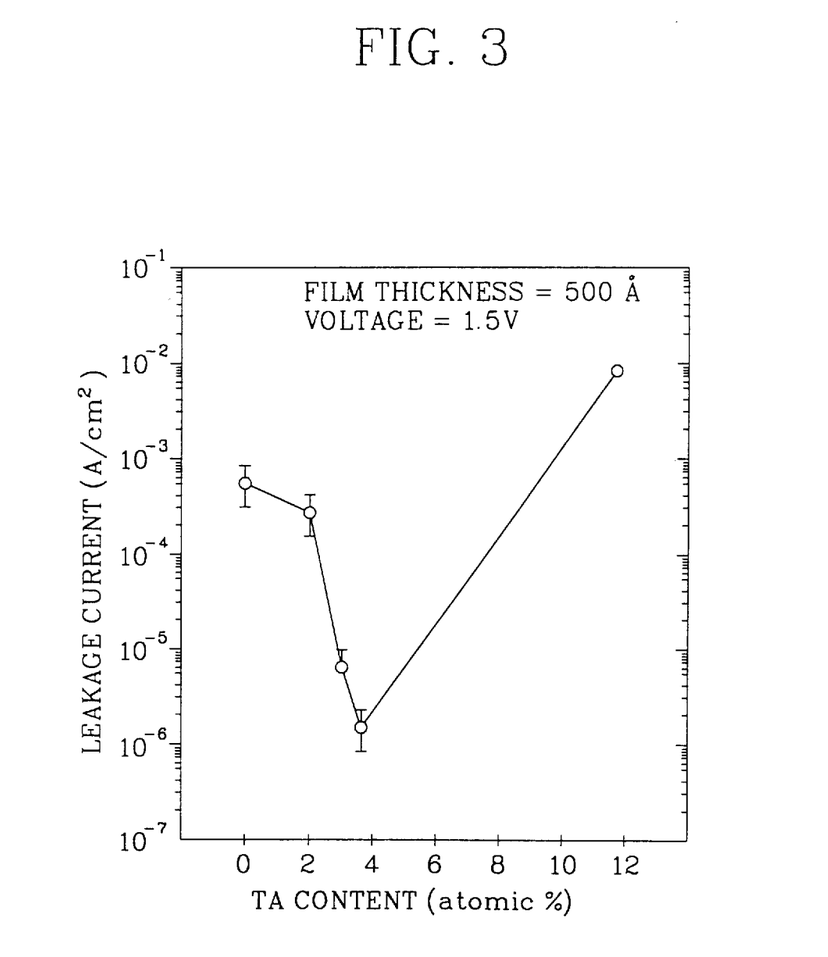
FIG. 3 is a graph of a leakage current variation of a BST thin film in accordance with the amount of Ta added into the BST thin film according to the present invention.

FIG. 3 shows a variation of the leakage current in accordance with an addition of Ta into the BST thin film. As seen therefrom, when the amount of Ta is increased, the leakage current is sharply decreased and then increased. When 3% of Ta is added thereinto, the leakage current is minimum.

That is, referring to FIGS. 2 and 3, the optimum addition amount of Ta is determined when 2–3 atom-percent is added into the BST thin film by weight based on the total weight so as to obtain a high dielectric constant and a less leakage current.

Therefore, when fabricating a capacitor of the semiconductor apparatus using the BST thin film containing Ta as a dielectric thin film, it is preferred to use the BST thin film containing Ta of which its amount is within the above-mentioned range.

Referring to FIGS. 4A through 4I, the method of fabricating a capacitor for the semiconductor apparatus using a BST thin film containing Ta by 2–3 atom-percent based on the total weight thereof will now be explained.

The method thereof is similar to that of the conventional method except for the composition ratio of a dielectric thin film formed between the storage electrode (the lower layer) and the plate electrode (the upper electrode) and a fabrication condition for fabricating the same. Therefore, the method thereof will now be explained in an assumption that a transistor is previously formed on the silicon substrate.

Figure 4A:
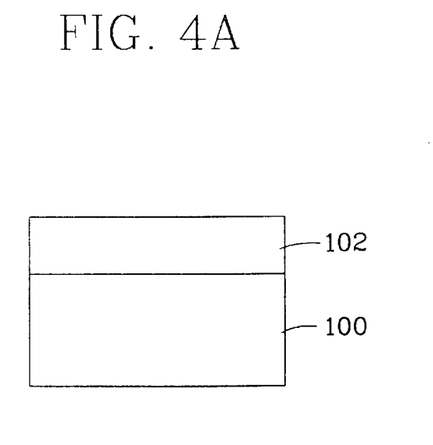
FIGS. 4A through 4I are cross-sectional views of a capacitor construction of a semiconductor apparatus adapting a dielectric thin film consisting of a BST into which Ta is added according to the present invention.
Figure 4B:
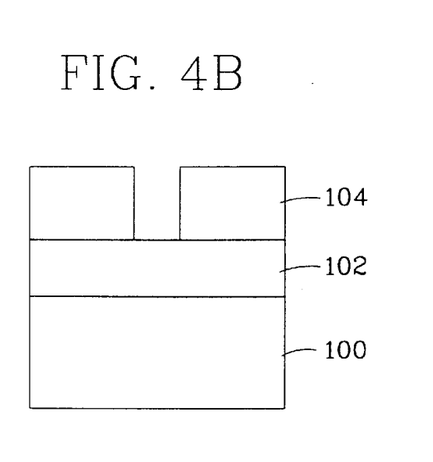

To begin with, as shown in FIG. 4A, an interlayer insulation film 102 is formed on the silicon substrate 100 on which a transistor is provided, and as shown in FIG. 4B, a predetermined portion of the interlayer insulation film 102 is exposed to the outside, and a photoresist pattern 104 is formed on the interlayer film 102.

Figure 4C:
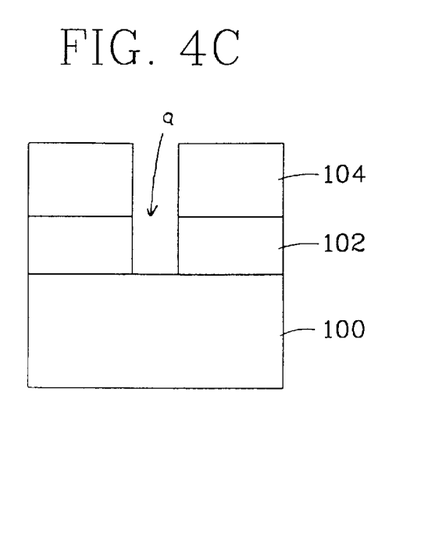

Thereafter, as shown in FIG. 4C, a predetermined portion of the silicon substrate 100 is exposed to the outside by etching the interlayer insulation film 102 with a mask of the photoresist pattern 104, and a contact window "a" is formed, and the photoresist pattern 104 is removed.

Figure 4D:
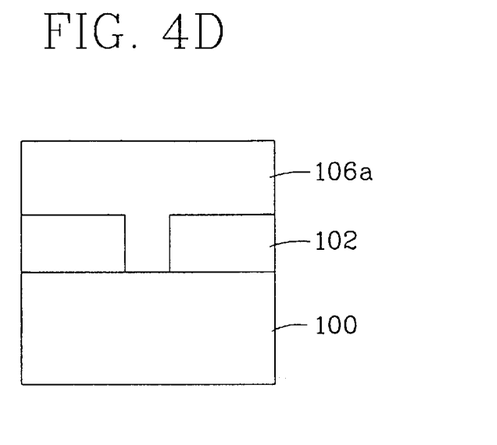
Figure 4E:
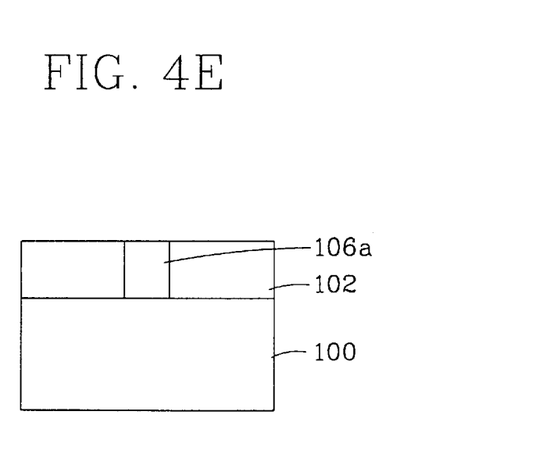

As shown in FIG. 4D, a polysillicon film 106a, which is an electrode material, is deposited on the interlayer insulation film 102 including the contact window "a", and the thusly deposited polysilicon film 106a is etched-back by more than the thickness of the deposition, so that the polysilicon film 106a is left at the interior of the contact window "a" as shown in FIG. 4E.

Figure 4F:
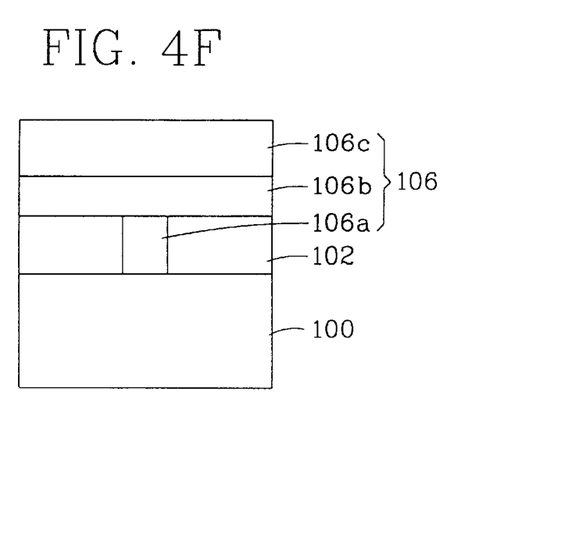

In addition, as shown in FIG. 4F, a TiN film 106b is deposited on the interlayer insulation film 102 and the polysilicon film 106a as a metal barrier, and a Pt electrode 106 is formed on the Tin film 106a.

Figure 4G:
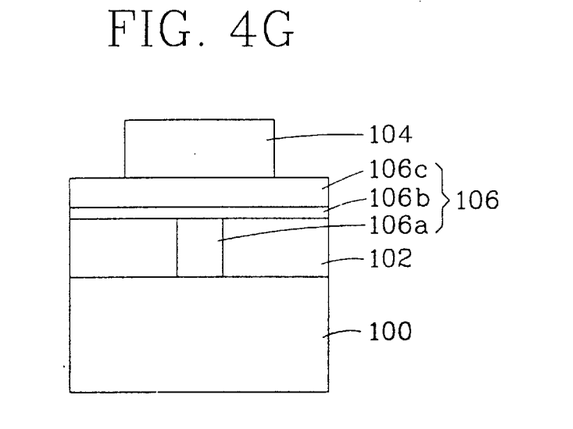

Thereafter, as shown in FIG. 4G, a photoresist pattern 104 is formed on a predetermined portion of the Pt electrode 106c, to which predetermined portions of the polisilicon film 106a and the interlayer insulation film 102 are included, respectively.

Figure 4H:
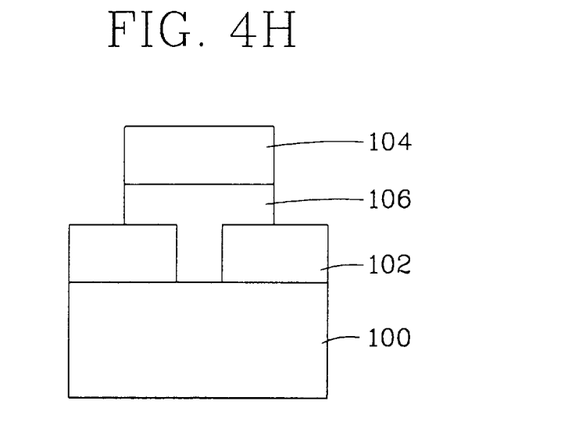
Figure 4I:
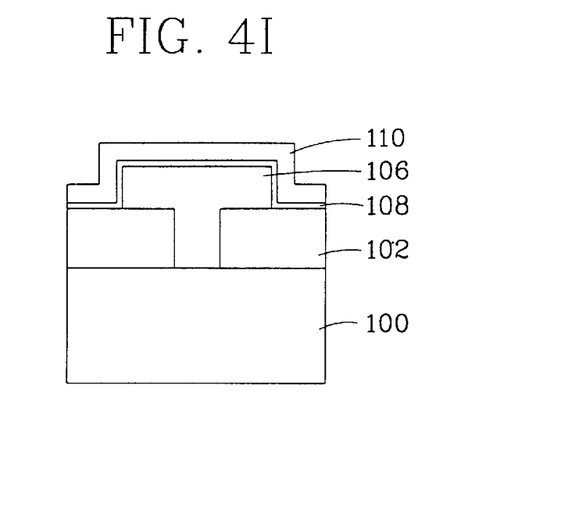

The Pt electrode 106c and the TiN film 106b are, as shown in FIG. 4H, etched so as to expose a predetermined portion of the interlayer insulation film 102 with a mask of the photoresist pattern 104, and forms a lower electrode 106 of the polysilicon film 106a/the TiN film 106b/the Pt electrode 106c, and the photoresist pattern 104 is removed. In FIGS. 4H and 4I, reference numeral 106 is given to the lower electrode as a single film construction.

The lower electrode 106 is mainly made of a base material of Pt, Ir, Ru, $IrO_2$, $RuO_2$, etc., which has a characteristic that it is not well oxidized under a strong oxidizing environment and is oxidized to a conductive oxide.

As shown in FIG. 4I, a BST thin film containing Ta, which is a dielectric thin film 108, is formed on the lower electrode 106 and the interlayer insulation film 102 under the above-mentioned condition in the sputtering method or the chemical vapor deposition method, so that a BST thin film is formed to have a thickness of 400–1000 Å.

That is, when forming a dielectric thin film on the lower electrode on the substrate in the sputtering method, the lower electrode is first formed, and a single target or a plurality of targets having a base component of Ba, Sr, Ti, and Ta are provided to the magnetron co-sputter apparatus. The targets are sputtered together with the sputtering gases such as oxygen, or argon or oxygen and argon. At this time, the kinds of a single target or a plurality of targets is previously described.

Meanwhile, when forming a dielectric thin film on the lower electrode on the substrate in a chemical vapor deposition method, a lower electrode is first formed, and the substrate on which the lower electrode is provided in the reaction container is heated to 400°–700° C., and a metal-organic compound or a metal halogen reaction source gas containing Ba, Sr, Ti, and Ta are introduced into the reaction container, and the reaction gases are decomposed by the heated substrate. Here, since the kinds of the metal-organic compound or a metal halogen reaction source gases are previously described, the description thereon is omitted.

Here, the dielectric thin film can be formed without using heat of the heated substrate. In this case, gases of a metal-organic compound or a metal halogen reaction source containing Ba, Sr, Ti, and Ta are introduced into the reaction container. Thereafter, an energy generated from a certain source such as plasma, infrared ray, electron ray, ion ray and X-ray is additionally applied into the reaction container, and then the substrate is heated to 100°–200° C.

Thereafter, an upper electrode 110 is formed on the dielectric thin film 108, so that a capacitor is fabricated.

As described above, the capacitor for a semiconductor apparatus fabricated using a BST thin film containing Ta has a relatively high dielectric constant and a lower dielectric dissicipation factor as compared to the conventional capacitor fabricated using a conventional insulation film or other dielectric thin films. In addition, it is possible to improve a storing capacity within a limited cell surface.

Moreover, since Ta is added into the BST when fabricating a dielectric thin film, it is possible to achieve a high dielectric constant, a lower dielectric dissipation factor, and a less leakage current, thereby obtaining a reliable dielectric thin film. In addition, when fabricating a capacitor, since a dielectric thin film is used, the reliability of semiconductor apparatus can be improved.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A dielectric thin film consisting essentially of (Ba, Sr) $TiO_3$ and Ta.

2. The dielectric thin film of claim 1, wherein said Ta is present in a range of 2–10 atom-percent based on the total weight of the (Ba, Sr)$TiO_3$ and Ta.

3. The dielectric thin film of claim 2, wherein said Ta is present in an amount of 10 atom-percent based on the total weight of the (Ba, Sr)$TiO_3$ and said Ta.

4. The dielectric thin film of claim 2, wherein said Ta is present in a range of 2–3 atom-percent based on the total weight of the (Ba, Sr)$TiO_3$ and Ta.

5. The dielectric thin film of claim 4, wherein said Ta is present in an amount of 2 atom-percent based on the total weight of the (Ba, Sr)$TiO_3$ and Ta.

6. The dielectric thin film of claim 4, wherein said Ta is present in an amount of 3 atom-percent based on the total weight of the (Ba, Sr)$TiO_3$ and Ta.

7. The dielectric thin film of claim 1, wherein said dielectric thin film has a thickness in a range of 200–2000 Å.

8. The dielectric thin film of claim 7, wherein said dielectric thin film has a thickness in a range of 400–1000 Å.

9. A method of forming a dielectric thin film consisting essentially of (Ba, Sr)$TiO_3$ and Ta, the method comprising the steps of:

providing a lower layer;

heating said lower layer; and concurrently sputtering Ba, Sr, Ti, and Ta onto said lower layer in a sputtering gas atmosphere.

10. The method of claim 9, wherein said lower layer is a storage electrode of a capacitor.

11. The method of claim 10, wherein said lower layer includes at least one of Pt, Ir, Ru, $IrO_2$, and $RuO_2$.

12. The method of claim 9, wherein said sputtering produces a ratio of Ta to (Ba, Sr)$TiO_3$ where Ta is in a range of 2–10 atom-percent based on the total weight of said (Ba, Sr)$TiO_3$ and said Ta.

13. The method of claim 9, wherein said sputtering gas includes oxygen, argon or a mixture thereof.

14. The method of claim 9, wherein said sputtering gas includes oxygen by 10–90 volume-percent based on the total weight of the sputtering gas.

15. The method of claim 9, wherein said dielectric thin film has a thickness of 200–2000 Å.

16. The method of claim 9, wherein said lower layer is heated to a temperature 400°–700°.

17. The method of claim 9, wherein said dielectric thin film is formed by using a target including (Ba, Sr)$TiO_3$ and Ta, or (Ba, Sr) $TiO_3$ and $Ta_2O_5$.

18. The method of claim 9, wherein said dielectric thin film is formed by concurrently sputtering a target of $BaTiO_3$, a target of $SrTiO_3$, and a target of Ta or $Ta_2O_5$.

19. The method of claim 9, wherein said dielectric thin film is formed by concurrently sputtering a target of Sr, Ti, and Ta and a target of Ba, Ti, and Ta.

20. The method of claim 9, wherein said dielectric thin film is formed by concurrently sputtering a target of Ba, Sr, Ti and a target of Ta or $Ta_2O_5$.

21. The method of claim 9, wherein said dielectric thin film is formed by concurrently sputtering a target of (Ba, Sr)$TiO_3$ and a target of Ta or $Ta_2O_5$.

22. The method of claim 9, wherein said dielectric thin film is formed by concurrently sputtering a target of $BaTiO_3$ and a target of Ta and $SrTiO_3$.

23. A method of forming a dielectric thin film consisting essentially of including (Ba, Sr)$TiO_3$ and Ta, the method comprising the steps of:

providing a lower layer within a reaction chamber;

heating said lower layer;

introducing into said reaction chamber at least one reactive source gas of a metal-organic compound or a metal halogen compound each containing Ba, Sr, Ti, and Ta to form said dielectric thin film via chemical vapor deposition (CVD).

24. The method of claim 23, wherein said lower layer is a storage electrode of a capacitor.

25. The method of claim 24, wherein said lower layer includes at least one of Pt, Ir, Ru, $IrO_2$, and $RuO_2$.

26. The method of claim 23, wherein said CVD produces a ratio of Ta to (Ba, Sr)$TiO_3$ where Ta is in a range of 2–10 atom-percent based on the total weight of said (Ba, Sr)$TiO_3$ and Ta.

27. The method of claim 23, wherein forms said dielectric thin film was a thickness of 200–2000 Å.

28. The method of claim 23, wherein said lower layer is heated to a temperature of 400°–7000°.

29. The method of claim 23, wherein said method introduces four metal-organic compound reactive source gases each containing Ba, Sr, Ti, and Ta or four metal halogen reactive source gases each containing the same.

30. The method of claim 23, wherein said dielectric thin film is formed by introducing a plurality of metal-organic compound reactive source gases each containing more than one element among Ba, Sr, Ti, and Ta or a plurality of metal halogen reactive source gases each containing the same into said reaction chamber.

31. The method of claim 23, wherein said method further comprises:

providing energy generated from plasma, infrared rays, electron rays, ion rays, or X-rays into the reaction container.

32. The method of claim 31, wherein said lower layer is heated to a temperature of 100°–200° C.

33. The method of claim 12, wherein said ratio of said Ta to said (Ba, Sr)$TiO_3$ is in a range of 2–3 atom-percent based on the total weight of said (Ba, Sr)$TiO_3$ and said Ta.

34. The method of claim 33, wherein said ratio of said Ta to said (Ba, Sr)$TiO_3$ is in an amount of 2 atom-percent based on the total weight of said (Ba, Sr)$TiO_3$ and said Ta.

35. The method of claim 33, wherein wherein said ratio of said Ta to said (Ba, Sr)$TiO_3$ is in an amount of 3 atom-percent based on the total-weight of said (Ba, Sr) $TiO_3$ and said Ta.

36. The method of claim 15, wherein said dielectric thin film has a thickness in a range of 400–1000 Å.

37. The method of claim 26, wherein said ratio of said Ta to said (Ba, Sr)$TiO_3$ is in a range of 2–3 atom-percent based on the total weight of said (Ba, Sr)$TiO_3$ and said Ta.

38. The method of claim 27, wherein wherein said ratio of said Ta to said (Ba, Sr)$TiO_3$ is in an amount of 2 atom-percent based on the total weight of said (Ba, Sr)$TiO_3$ and said Ta.

39. The dielectric thin film of claim 37, wherein said ratio of said Ta to said (Ba, Sr)$TiO_3$ is in an amount of 3 atom-percent based on the total weight of said (Ba, Sr)$TiO_3$ and said Ta.

40. The method of claim 27, wherein said dielectric thin film has a thickness in a range of 400–1000 Å.

41. The method of claim 16, wherein said lower layer is heated to a temperature in a range of 550° C.–600° C.

42. The method of claim 41, wherein said lower layer is heated to a temperature of 550° C.

43. The method of claim 28, wherein said lower layer is heated to a temperature in a range of 550° C.–600° C.

44. The method of claim 43, wherein said lower layer is heated to a temperature of 550° C.

* * * * *